United States Patent
Schuster et al.

(10) Patent No.: US 7,495,444 B2
(45) Date of Patent: Feb. 24, 2009

(54) GRADIENT COIL COOLING DEVICE AND METHOD FOR THE MANUFACTURE THEREOF

(75) Inventors: Johann Schuster, Oberasbach (DE); Lothar Schoen, Neunkirchen (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/829,164

(22) Filed: Jul. 27, 2007

(65) Prior Publication Data

US 2008/0024134 A1    Jan. 31, 2008

(30) Foreign Application Priority Data

Jul. 27, 2006   (DE) ................. 10 2006 034 800

(51) Int. Cl.
  *G01V 3/00*   (2006.01)
(52) U.S. Cl. ............................................. 324/318
(58) Field of Classification Search ................. 324/318; 165/177, 183
  See application file for complete search history.

(56) References Cited

U.S. PATENT DOCUMENTS

| | | | |
|---|---|---|---|
| 6,111,412 A | 8/2000 | Boemmel et al. | |
| 6,236,207 B1 * | 5/2001 | Arz et al. | 324/318 |
| 7,140,420 B2 * | 11/2006 | Arik et al. | 165/80.2 |
| 7,154,270 B2 | 12/2006 | Arz et al. | |
| 2003/0010485 A1 * | 1/2003 | Goldman et al. | 165/183 |
| 2005/0093543 A1 * | 5/2005 | Arik et al. | 324/318 |

\* cited by examiner

*Primary Examiner*—Brij B. Shrivastav
*Assistant Examiner*—Megann E Vaughn
(74) *Attorney, Agent, or Firm*—Schiff Hardin LLP

(57) ABSTRACT

In a method for manufacturing a cooling device for a gradient coil, the cooling device having at least one flexible cooling tube arranged on a carrier plate configured in accordance with a predetermined pattern, the at least one cooling tube originally having a circular cross section, is laid in accordance with the predetermined pattern and is flattened to permanently deform its cross section.

7 Claims, 2 Drawing Sheets

GRADIENT COIL COOLING DEVICE AND METHOD FOR THE MANUFACTURE THEREOF

BACKGROUND OF THE INVENTION

1. Field of the Invention

The present invention concerns a method for manufacturing a cooling device for a gradient coil, the cooling device being of the type having at least one flexible cooling tube arranged on a carrier plate so as to be configured in a predetermined pattern.

2. Description of the Prior Art

A cooling device of the above type is known, for example, from DE 197 21 985 A1. It has a flexible cooling tube which can be made of metal or plastic, and which is laid out in a predetermined pattern on the course of the coil windings of the adjacent gradient coil group with which the cooling device is to be connected. The cooling tube—usually a number of plastic tubes which are connected to form separate cooling circuits—is attached to a suitable carrier plate that is designed to pro-vide electrical isolation, but is sufficiently flexible for the entire cooling device to be able to be bent if necessary if the gradient coil is a cylindrical coil. For fixing the cooling tube to the carrier plate, for example a glass rein-forced plastic plate, one method is to use elastic threads, meaning the tube or tubes are sewn onto the plate. However it is also conceivable for the cooling tube to be fixed to the carrier at a number of points using an adhesive.

Such a cooling device makes it possible to remove the heat arising during operation of the gradient coil. A gradient coil usually features a number of coils in order to create three magnetic field gradients standing at right angles to each other. With today's frequently used actively shielded gradient coils, in addition to the primary coil creating the useful field, secondary coils are present that prevent eddy currents that arise in metallic parts of a basic field magnet surrounding the gradient coil. These secondary coils are arranged concentrically around the primary coil and at a distance from this coil. Typically pulsed current on the order of magnitude of several hundred A, usually approx. 300 A, flows through each gradient coil. The ohmic resistance of the coil causes a considerable amount of energy to be converted into heat. To avoid excessive heating of the gradient coil and of the interior of the magnetic resonance de-vice in which the patient lies, this heat must be removed. This is done to great effect by a cooling device, as described in DE 197 21 985 A1.

Plastic tubes with a circular cross section, usually a PA tube, are used as cooling tubes for manufacturing such a cooling device, which are arranged on a carrier plate which is usually around 1 mm thick. Such a cooling device is fitted as described between the individual coil layers and molded together with the coil layers into a carrier matrix, for example made from epoxy resin. Typically a number of cooling tubes, each of approximately 100 m in length, are inserted for each coil in a number of parallel cooling circuits using a number of such cooling devices. As a result of the mandatory requirement for integration of the cooling device in the gradient coil, this arrangement has a considerable radial extent, which, due to the limited installation volume available for a gradient coil and the desire to make the patient chamber as large as possible, is not desirable. In addition there is always the desire to further improve the cooling performance.

SUMMARY OF THE INVENTION

An object of the present invention is to provide a method for manufacturing a cooling device as well as a cooling device, with which an improved cooling performance can be achieved, while reducing the radial extent in the installation of the cooling device in the magnetic resonance apparatus (scanner).

This object is achieved in accordance with the invention by a method of the type described above wherein at least one cooling tube thereof having a circular cross section is pressed flat while the cooling tube laid in the predetermined pattern in the carrier, so that its cross-sectional shape is permanently deformed.

In the inventive and the cooling device manufactured according thereto, the original cooling tube that is round in cross section is actively deformed by being pressed flat using a tool. The deformation is permanent, meaning that the cooling tube, if it is a metal or plastic tube, no longer relaxes into its original circular cross section, but remains in a flattened shape on the carrier. This enables the heat transfer surface to be enlarged to particular advantage or allows the distance to the heat source to be increased with equally good conductivity of tube material and encapsulation, which results in better cooling, since significantly more heat can be captured and removed via the enlarged heat transfer surface. The radial space requirement for the cooling device also can be reduced in this way, so that the entire radial structural extent of the gradient coil can be reduced. The resulting gradient coil arrangement also benefit from this radial space gain, since the effectiveness of the gradient field generation increases with approximately the power of five of the radius with a reduction in radius. Conversely, lower power dissipation can be achieved with the sensitivity being maintained the same, for example.

The deformation can be undertaken only to the point at which no significant increase in the flow resistance arises from the deformation. The reduction in radius caused by the flattening thus should be selected so that no significant increase in the flow resistance, or an inappropriately large reduction of the hydraulic pressure, is produced. For example, it is easily possible to compress a cooling tube with an internal diameter of 6 mm by 1.5-2 mm in diameter.

A further significant advantage in addition to the flat cooling structure is that less tube length is required, since, as a result of the flattening, the width of the tube is unavoidably increased, combined with the enlargement of the heat transfer surface. This enables a significant saving to be made in tube length, which reduces production costs. A reduction in the number of parallel circuits can also be achieved in this way, so that the number of tube couplings for coolant supply and a possible risk of leakage can be reduced.

Expediently the cooling tube is deformed into an essentially oval form with flat upper and lower side. The flat side surfaces enable a large transfer surface to be achieved with the distance from the side of the tube to the coil windings remaining the same on the side on which the direct heat coupling to the adjacent coil windings exists.

Basically two different manufacturing processes are possible. According to a first alternative the cooling tube is laid in a winding plate profiled in accordance with the predetermined configuration, and is then deformed and then connected to the carrier plate. This type of normally flat winding plate has winding grooves in which the original round cooling tube is laid. The cross-sectional form of the grooves of the winding plate can be rectangular or in the desired oval shape, in each case a sufficient groove width must be provided which accepts the widening out of the cooling tube resulting from its compression. After the permanent deformation of the cooling tube, in this inventive embodiment the carrier plate, i.e. for example approx. 1 mm thick GRP insulation plate, is joined to the tube, for example sewn or glued to it.

In an alternative method embodiment, the plastic tube is laid in accordance with the predetermined pattern directly on the carrier plate and is connected to the carrier plate, for example sewed or glued, after which it is de-formed. Here the deformation of the tube is undertaken with the tube already fixed to the plate.

It is particularly useful, when using a plastic cooling tube for the cooling tube to be heated before and if necessary during the deformation, preferably to the extent where it is plastically deformable, so that a permanent deformation ultimately can be achieved.

For deformation a suitable tool in the form of a pressure plate is used to press down on one side of the cooling tubes once they have been laid and are supported appropriately from the opposite side. In the event of the cooling tube being laid in a winding plate, the cooling plate serves as the support plate, with the pressure plate being pressed directly down onto the cooling tube protruding from the winding plate surface and forming the latter into the winding-plate-side groove. With the manufacturing alternative in which the non-deformed cooling tube is initially accommodated on the carrier plate and is only then deformed, an opposing support plate providing sup-port in the opposite direction to the carrier plate is expediently provided, with the pressure plate being pressed down from the other side on the non-attached cooling tube to deform it. The cooling tube can in this case be heated using the pressure plate or the counter plate, whether this is the winding plate or a separate counter plate, or by the pressure plate and the counter plate. The duration of the shaping process can be designed to last until it has been ensured that a complete heating-up of the tube material has occurred, i.e. that the plastic tube has actually be plasticly deformed and the deformation obtained does not relax again. The cooling can take place with the press tool still closed, meaning that the flattened cooling tubes cool down with the load still applied by the pressure plate. Alternatively there is the option of opening the tool before cooling is completed and letting the cooling tube cool down in the non-loaded state.

In addition to the method, the invention further relates to a cooling device for a gradient coil, which is manufactured according to the described method. The cooling device includes a carrier plate with at least one cooling tube arranged thereon, configured in accordance with a predetermined pattern, which has a flat, particularly an oval shape, with a flat upper and lower side. Although it is especially useful to produce the cooling device by reshaping cooling tubes that were originally round in cross section, it is possible to use appropriately flattened, prefabricated cooling tubes in this shape, but this makes it more difficult to lay the tubes since these flat cooling tubes tend to lift up in the area of a bend. Nevertheless this tendency can be compensated by local heating of the tube material, primarily in the case of a plastic tube, since this produces a sufficient ability for the flat tube to be deformed in this area, so that it can be formed into the flat section tube.

The invention also concerns a gradient coil having a number of cooling devices of the above type, regardless of how these have been manufactured.

DESCRIPTION OF THE PREFERRED EMBODIMENTS

Figure 1:
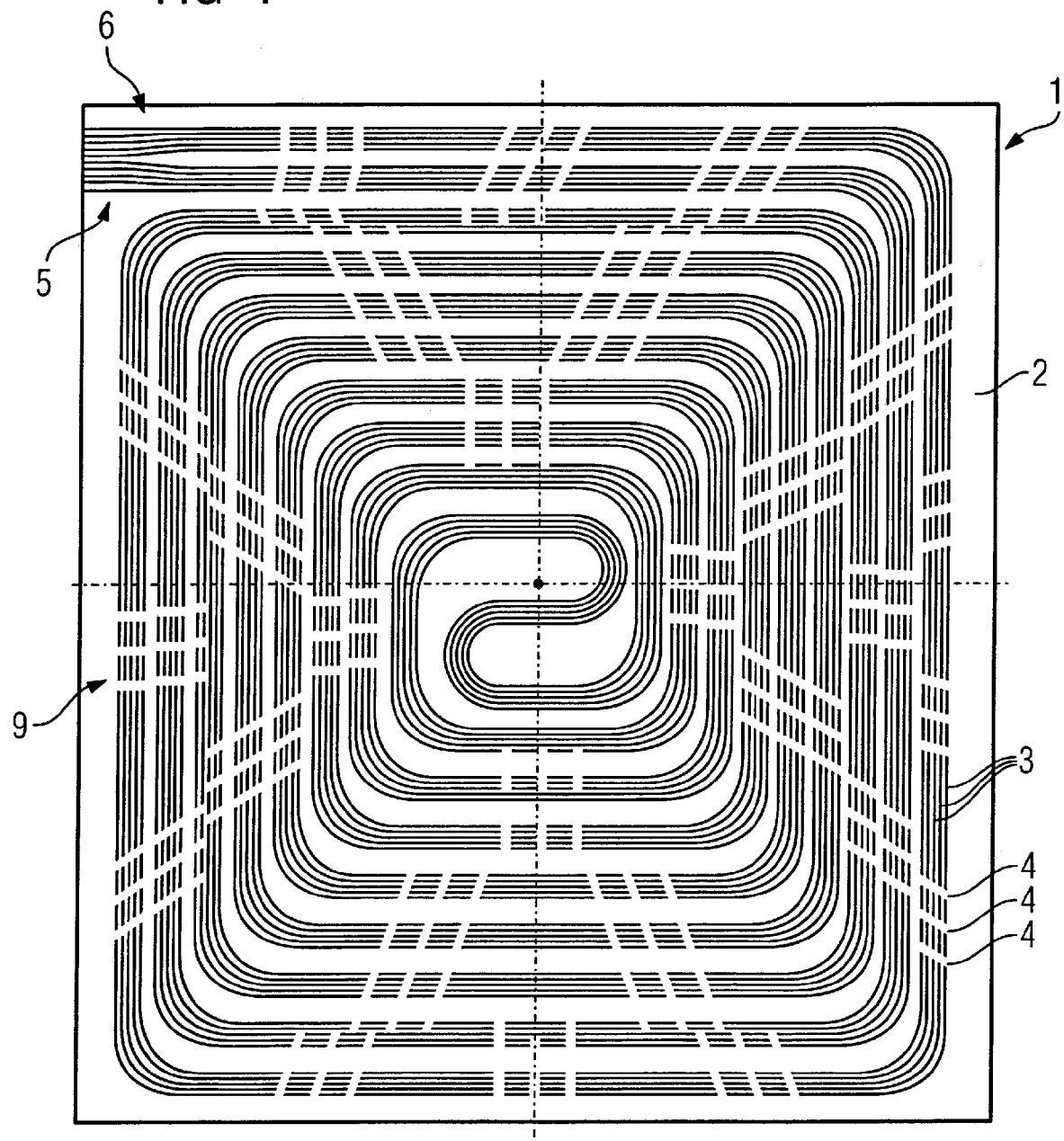
FIG. 1 is a schematic illustration of an inventive cooling device as seen from above.

FIG. 1 shows an inventive cooling device 1 having a carrier plate 2, for example a GRP plate. A number of cooling tubes 3 running in parallel are attached to this in the shape of a predetermined pattern, for example by sewing them onto the carrier plate 2, as indicated by the threads 4. The cooling tubes 3 are for example plastic tubes, which, as will be discussed below, are deformed from their original circular form when viewed in cross section into a flat, essentially oval shape with flat surfaces. The cooling device 1 has flat surfaces here. Usually such cooling devices are built into cylindrical gradient coils, which is why the cooling device 1 is bent in the built-in situation, usually by approximately 180°. Not shown in detail are corresponding connections which, to connect the individual cooling tubes 3 which each form a separate circuit, are to be provided with a coolant feed. These connections are mounted at the inlets and outlets 5, 6 of the cooling tube 3 positioned at a common location.

Figure 2:
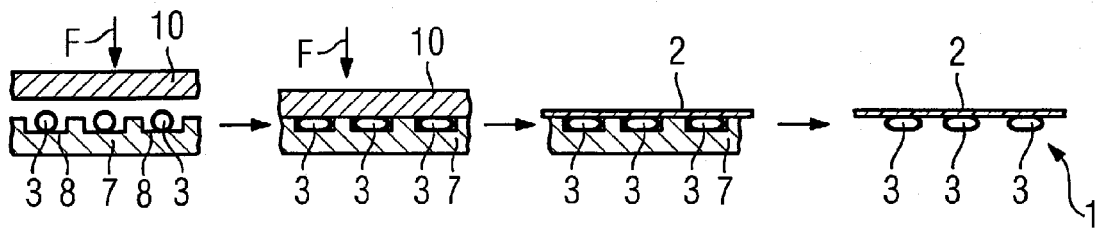
FIG. 2 is a basic illustration to explain the inventive productive method in a first embodiment.

FIG. 2 shows a first variant of the method of manufacturing the cooling device from FIG. 1. A section of a winding plate 7 is shown, into which a number of grooves 8 are made, which run in accordance with the predetermined pattern 9 of the course of the cooling tubes 3, see FIG. 1. The grooves 8 are essentially rectangular in cross-section and wider than they are deep. The cooling tubes 3 are laid in the grooves 8. Then pressure is applied with a pressure plate 10 on the cooling tubes 3. Preferably plastic tubes made of polyamide (PA) protruding from the winding plate surface, as shown by the arrow F. The winding plate 7 and/or the pressure plate 10 can be heated up in this case, so that the cooling tubes 3 also heat up as pressure is applied, and do so at a temperature at which the plastic material is able to be plasticly deformed.

As shown, the pressure plate 10 is pressed onto the winding plate 7. When this is done the cooling tubes 3 are deformed, they largely adapt to the form of the grooves 8 and are inevitably compressed, see FIG. 2. As a result of the heating through a material temperature which allows plastic deformation the deformed cooling tubes 3 remain in the compressed form, even when the pressure plate 10 is lifted again after the compression. The cooled cooling tubes 3 still accommodated in the winding plate 3 are subsequently connected to the carrier plate 2. These are laid directly on the winding plate 7, after which the carrier plate 2 is sown to the cooling tubes 3. After the sowing, for which a more or less elastic plastic thread is used, the insulating plate 2 along with the cooling tubes 3 attached to it, thus the largely complete cooling device 1 (the connections to the inlets and outlets 5, 6 may still be missing) is removed from the winding plate 7.

It can be seen that the cooling tubes 3 now have a cross sectional profile which differs markedly from the original circular shape. They are essentially oval and have top and bottom flattened faces.

Figure 3:
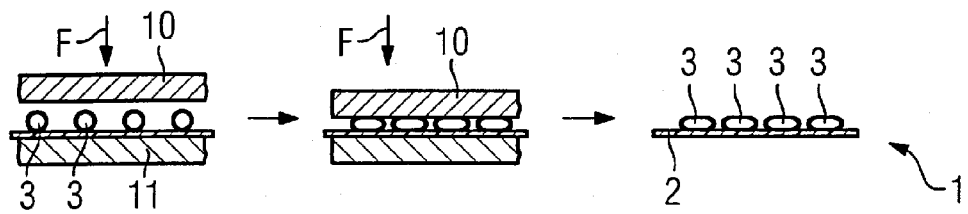
FIG. 3 is a basic illustration to explain the inventive manufacturing method in a second embodiment.

FIG. 3 shows a further alternative manufacturing variant. Here the cooling tubes 3 are connected before being deformed to the carrier plate 2, once again for example by sowing, but gluing would also be conceivable. This means that the plastic tubes 3 are already laid and attached in the predetermined pattern 9 on the carrier plate 2. The carrier plate 2 is now laid onto a counter plate 11 after which the pressure plate 10, as indicated by the arrow F is again pressed onto the free, still undeformed and circular cooling tubes 3. These are plasticly deformed while heat is simultaneously applied to them via the pressure plate 10 and/or the counter plate 11, meaning that the pressure plate 10 is lowered in a defined manner until the desired form is assumed. The pressure plate is then lifted again, either with the cooling tubes already cooled or with cooling tubes which are still warm but no longer reforming themselves into their original shape, after which—if necessary except for the missing connections at the inlets and outlets 5, 6—the cooling device 1 is manufactured. It can also be seen that the cooling tubes 3 exhibit an essentially oval profile with a flat upper and lower face.

Figure 4:
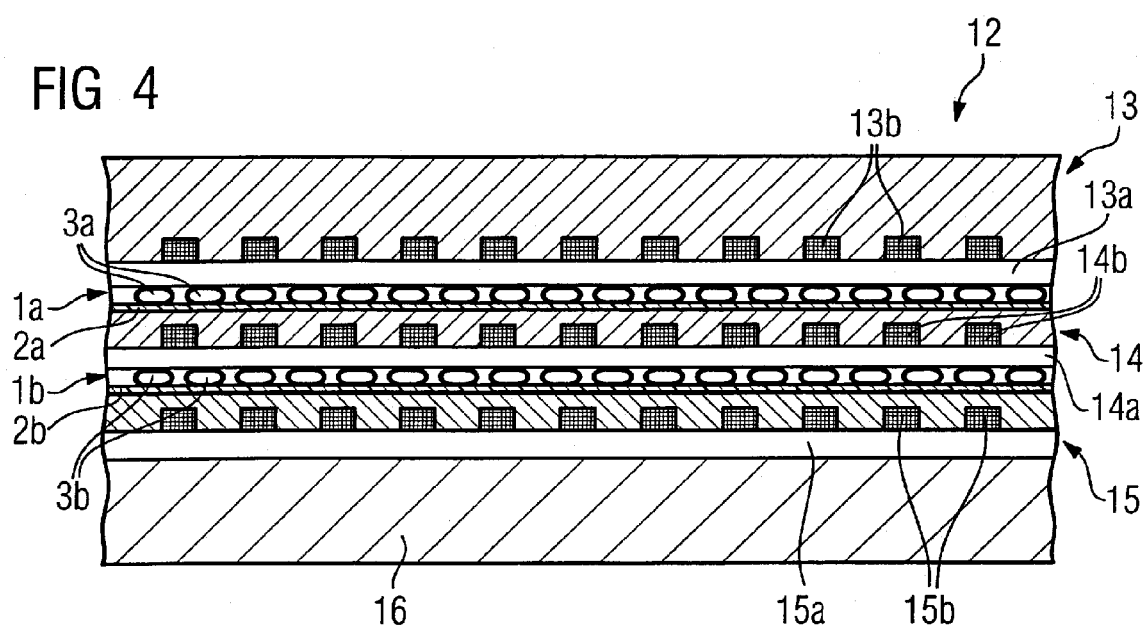
FIG. 4 is a partial view in cross section of an inventive gradient coil.

FIG. 4 shows a basic illustration of part of an inventive gradient coil 12 in cross section. Three flat coils are shown in this diagram, a first inner flat coil 13 composed of a coil carrier 13*a* and coil windings 13*b* mounted thereon, a second flat coil 14 composed of a coil carrier 14*a* and the coil formers 14*b*, as well as a third flat coil 15 composed of the coil carrier 15*a* and the winding 15*b* located on it. The entire gradient coil features two flat coils 13 or 14 or 15 which in each case extend through around 180° and supplement each other to form a coil ring.

Between two flat coils in each case, i.e. between the flat coils 13 and 14 or 14 and 15, is placed a cooling device 1*a* or 1*b*. Each of the flat coils is composed, in the manner described, of the carrier plate 2*a* or 2*b* as well as the cooling tubes 3*a* or 3*b*, which have been deformed in the inventive manner. It can be seen that this deformation produces a markedly greater heat transfer surface in relation to the adjacent flat coil in each case, whether it is the coil windings or the coil carriers at this location, so that a markedly better cooling performance and a reduction in the radial structure can be achieved. The entire structure is encapsulated in a resin matrix 16, such as hypo oxide resin for example, with the resin matrix 16 forming the outer face and the inner face of the gradient coil 12 and filling all the spaces between coil conductors and cooling tubes.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for manufacturing a cooling device for a gradient coil, comprising the steps of:
    arranging at least one flexible cooling tube in a predetermined pattern conforming to a conductor pattern of a magnetic resonance gradient coil, said at least one flexible cooling tube originally having a cross-section having a circular shape;
    permanently deforming said cross-section of said at least one flexible cooling tube to a flattened crossed-section; and
    only thereafter placing said at least one flexible cooling tube, having said flattened cross-section and in said predetermined pattern, on a carrier plate configured to accept said gradient coil with said conductor pattern.

2. A method as claimed in claim 1 comprising deforming said cross-section of said cooling tube into a substantially oval shape, with a flattened upper face and a flattened lower face.

3. A method as claimed in claim 1 comprising first arranging said at least one flexible cooling tube on a winding plate and subsequently deforming said at least one cooling tube on said winding plate and then joining the deformed cooling tube to said carrier plate.

4. A method as claimed in claim 1 comprising deforming said cross-section of said cooling tube by applying a pressure plate to one side of said cooling tube and a counter plate to an opposite side of said cooling tube.

5. A method as claimed in claim 4 comprising heating said cooling tube with a heating arrangement contained in at least one of said pressure plate and said counter plate.

6. A method as claimed in claim 1 comprising heating said cooling tube at a time selected from the group consisting of before deforming said cross-section of said cooling tube and while deforming said cross-section of said cooling tube.

7. A gradient coil assembly comprising:
    a carrier plate;
    a magnetic resonance gradient coil conductor affixed to said carrier plate, each in a predetermined conductor pattern; and
    two cooling devices each comprising a cooling tube affixed to said carrier plate in a pattern conforming to said predetermined conductor pattern, each cooling tube having a flattened cross-section with flattened faces, with one of said flattened faces being adjacent to said carrier plate, said cooling tubes being respectively located at opposite sides of said carrier plate.

* * * * *